United States Patent
Faragi et al.

[19]

[11] Patent Number: 6,118,081
[45] Date of Patent: Sep. 12, 2000

[54] COMPONENT TO SUBSTRATE CONNECTION BY RUNNERS AND PADS

[75] Inventors: Eric Joseph Faragi; Asoka Aldous Veeravagu, both of Boynton Beach, Fla.

[73] Assignee: Motorola, Inc., Schaumburg, Ill.

[21] Appl. No.: 09/106,540

[22] Filed: Jun. 29, 1998

[51] Int. Cl.[7] .................................................. H05K 1/16
[52] U.S. Cl. ........................... 174/260; 174/261; 361/771
[58] Field of Search ........................ 439/67, 77; 174/250, 174/261, 268, 260; 257/690; 361/767, 768, 777, 784, 789

[56] References Cited

U.S. PATENT DOCUMENTS

| | | | |
|---|---|---|---|
| 5,273,938 | 12/1993 | Lin et al. ................................. | 438/107 |
| 5,428,505 | 6/1995 | Sakemi et al. .......................... | 361/777 |
| 5,742,009 | 4/1998 | Hamzehoost ............................ | 174/260 |
| 5,742,484 | 4/1998 | Gillette et al. .......................... | 361/789 |
| 5,811,727 | 9/1998 | Lo ............................................ | 174/36 |
| 5,821,609 | 10/1998 | DiStefano et al. ...................... | 257/669 |

*Primary Examiner*—Jeffrey Gaffin
*Assistant Examiner*—Kamand Cuneo
*Attorney, Agent, or Firm*—Randi L. Dulaney

[57] ABSTRACT

An electrical connection is formed between a plurality of substrate conductive runners (52) and a plurality of substrate conductive pads (54) arranged in an alternating pattern on a substrate (32) and a plurality of component conductive runners (48) and a plurality of component conductive pads (50) arranged in an alternating pattern on an electrical component (40) through a plurality of conductive pads (60) and conductive runners (58) arranged in an alternating pattern on a connector (34). A display assembly (26) advantageously employs the electrical connection.

13 Claims, 4 Drawing Sheets

COMPONENT TO SUBSTRATE CONNECTION BY RUNNERS AND PADS

FIELD OF THE INVENTION

This invention relates to apparatus for forming an electrical connection between bonding pads or the like of an electrical component and electrical conductors on a substrate.

BACKGROUND OF THE INVENTION

Making electrical connections between an electrical component and a substrate such as a PCB (Printed Circuit Board) in a high volume manufacturing process typically requires consideration of factors such as: the pitch of the conductive runners on the electrical component, the pitch of the conductive runners on the PCB and the means of attachment between the PCB and the electrical component.

Alignment requirements of conductive runners with small pitches (less than 50 mils) have typically required the use of a HSC (Heat Seal Connector) type connection.

FIG. 1 illustrates the use of a conventional HSC 20 for electrically connecting a component conductive connector 18 which is made up of a plurality of component conductive runners 10 on a LCD (Liquid Crystal Display) panel 12 to a substrate conductive connector 24 which is made up of a plurality of substrate conductive runners 14 on a PCB 16. The conventional substrate conductive runners 14 are coupled to electrical parts (not shown) on the PCB 16.

A conventional HSC 20 is used as the connecting mechanism. The illustrated conventional HSC 20 has a plurality of conventional heat seal conductive runners 22 bonded on one side by heat sealing to the conventional component conductive runners 10 on the LCD panel 12, and bonded on the other side to the conventional substrate conductive runners 14 on the PCB 16.

High volume manufacturing processing of assemblies connected using conventional fine pitch HSCs is hindered by the limited allowable registration tolerance. Manufacturing efficiency, manufacturing assembly time, and manufacturing quality would benefit from an increased allowable registration tolerance.

DESCRIPTION OF THE PREFERRED EMBODIMENT

Figure 2:
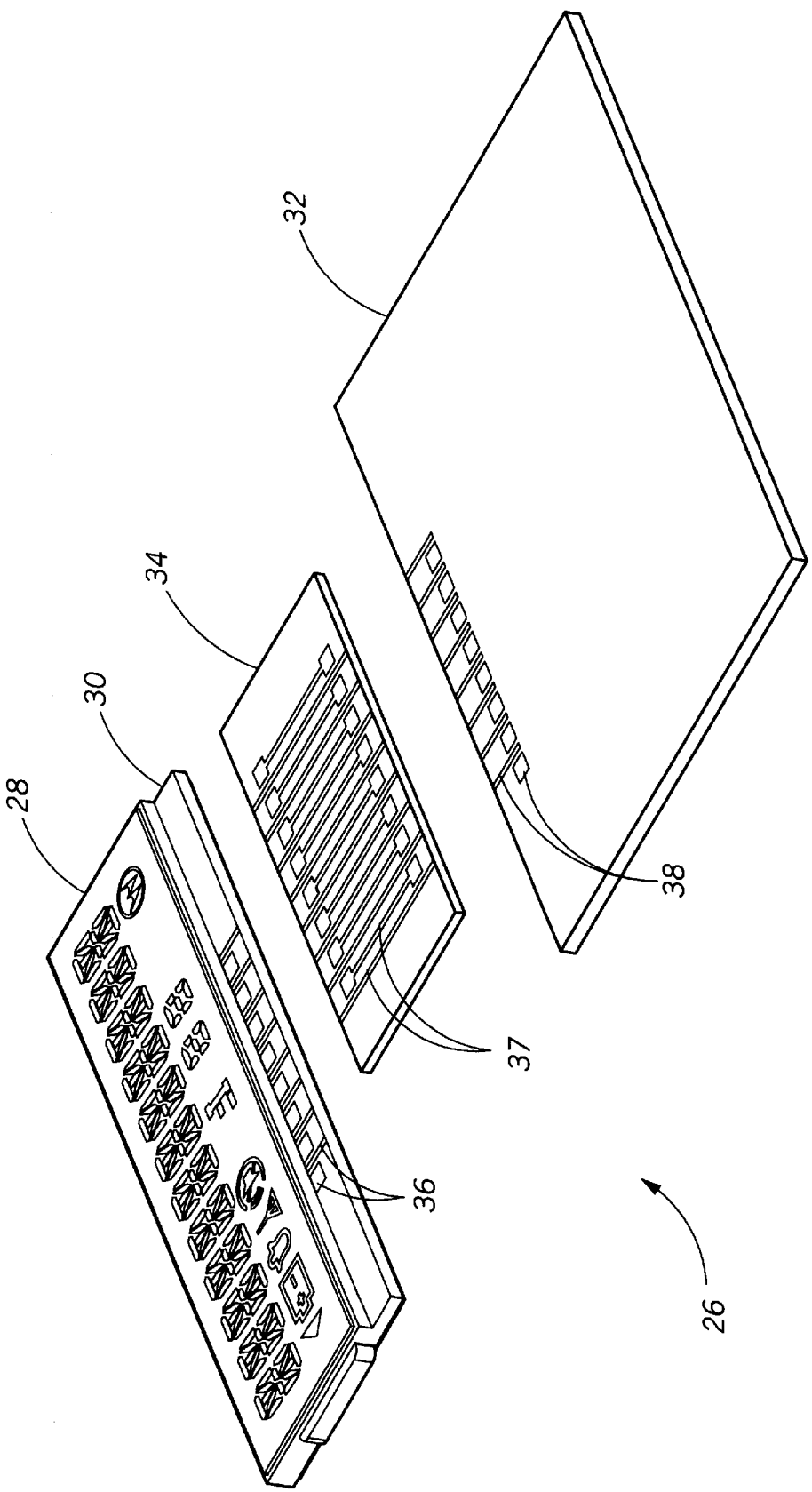
FIG. 2 is an exploded view of a display assembly that is constructed according to the invention.

Referring to FIG. 2, a display assembly 26 which is constructed in accordance with the invention includes a LCD 28, a heat seal connector 34 and a substrate 32. The LCD 28 is driven by electronic circuitry (not shown) that is mounted on the substrate 32 which may be a PCB. Electrical connections between that electronic circuitry and the LCD 28 are made via a plurality of LCD conductive pads and runners 36 situated on a bonding shelf 30 and a plurality of PCB conductive pads and runners 38 situated near an edge of the substrate 32. An electrical connection is made by bonding HSC conductive pads and runners 37 on the heat seal connector 34 to the bonding shelf 30 on one side and the substrate 32 on the other side.

The apparatus used to make the electrical connection between the substrate 32 and the LCD 28 (described in more detail below) permits the use of a fine pitch HSC connection by providing for an ample degree of tolerance in aligning the PCB conductive pads and runners 38 on the substrate 32 with the LCD conductive pads and runners 36 on the bonding shelf 30 of the LCD 28. Consequently, the display assembly 26 is well suited for use in electronic display products that are produced in high volume, such as pagers and the like.

Figure 3:
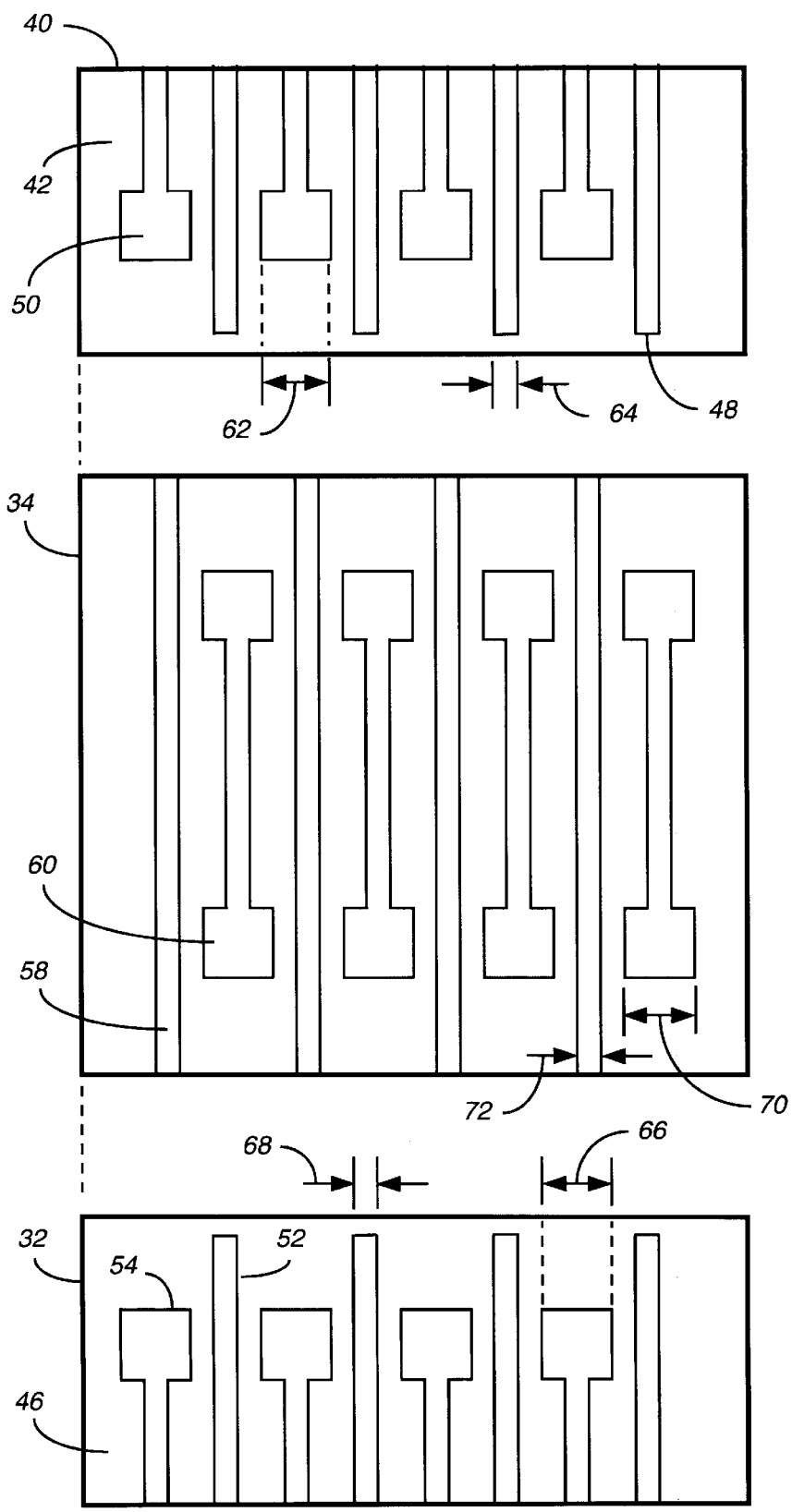
FIG. 3 illustrates a substrate, heat seal connector, and electrical component having an arrangement of conductive runners and pads, the combination forming a connection according to the invention.

Referring now to FIG. 3, more detail of the substrate 32, the heat seal connector 34, and an electrical component 40 (similar to the LCD 28 of FIG. 2), each having an arrangement of conductive runners and pads, the combination forming an apparatus 39 for component to substrate connection according to the invention is shown.

A plurality of component conductive runners 48 and a plurality of component conductive pads 50 are fabricated on the illustrated electrical component surface 42 of the electrical component 40. These pads and runners are arranged in a pattern of alternating component conductive pads 50 and component conductive runners 48. Preferably, all the component conductive pads 50 are of substantially equal sized component pad width 62; and all the component conductive runners 48 are of substantially equal sized component runner width 64. In a preferred embodiment, the component pad width 62 is within the range of 2 to 5 times the component runner width 64. A ratio below 2 would be too tight for manufacturability; and a ratio above 5 would not require the use of this invention. Each component conductive runner 48 and each component conductive pad 50 connect to one or more electrical elements (not shown) in the electrical component 40. The component conductive pads 50 and the component conductive runners 48 may be made of indium tin oxide, or an equivalent.

Similarly, a plurality of substrate conductive runners 52 and a plurality of substrate conductive pads 54 are formed on the illustrated substrate surface 46 of the substrate 32. These pads and runners are arranged in a pattern of alternating substrate conductive pads 54 and substrate conductive runners 52. Preferably, all the substrate conductive pads 54 are of substantially equal sized substrate pad width 66; and all the substrate conductive runners 52 are of substantially equal sized substrate runner width 68. In a preferred embodiment, the substrate pad width 66 is within the range of 2 to 5 times the substrate runner width 68. Each substrate conductive runner 52 and each substrate conductive pad 54 connect to one or more electrical elements (not shown) on the substrate 32. The substrate conductive pads 54 and the substrate conductive runners 52 may be made of copper with gold plating, or an equivalent.

The electrical connection between the electrical component 40 and the substrate 32 is accomplished by heat seal bonding the heat seal connector 34 to the electrical component 40 on one side to the substrate 32 on the other side through a plurality of heat seal conductive runners 58 and a plurality of heat seal conductive pads 60 fabricated on the illustrated heat seal connector 34. These pads and runners are arranged in a pattern of alternating heat seal conductive pads 60 and heat seal conductive runners 58. Preferably, all the heat seal conductive pads 60 are of substantially equal sized heat seal pad width 70; and all the heat seal conductive runners 58 are of substantially equal sized heat seal runner width 72. In a preferred embodiment, the heat seal pad width 70 is within the range of 2 to 5 times the heat seal runner width 72.

Each heat seal conductive runner 58 is heat seal bonded on one side to a component conductive pad 50 and on the other side to a substrate conductive pad 54, forming an electrical connection. Each heat seal conductive pad 60 is heat seal bonded on one side to a component conductive runner 48 and on the other side to a substrate conductive runner 52. In a preferred embodiment, the component pad width 62 and substrate pad width 66 are within the range of 2 to 5 times the heat seal runner width 72; and the heat seal pad width 70 is within the range of 2 to 5 times the component runner width 64 and the substrate runner width 68; increasing the allowable assembly tolerance as compared to conventional heat seal connections. The heat seal conductive pads 60 and the heat seal conductive runners 58 may be made carbon or silver or an equivalent, and assembled on a base material such as polyester film, or an equivalent. Adhesive is used to bond the assembly together.

Figure 1:
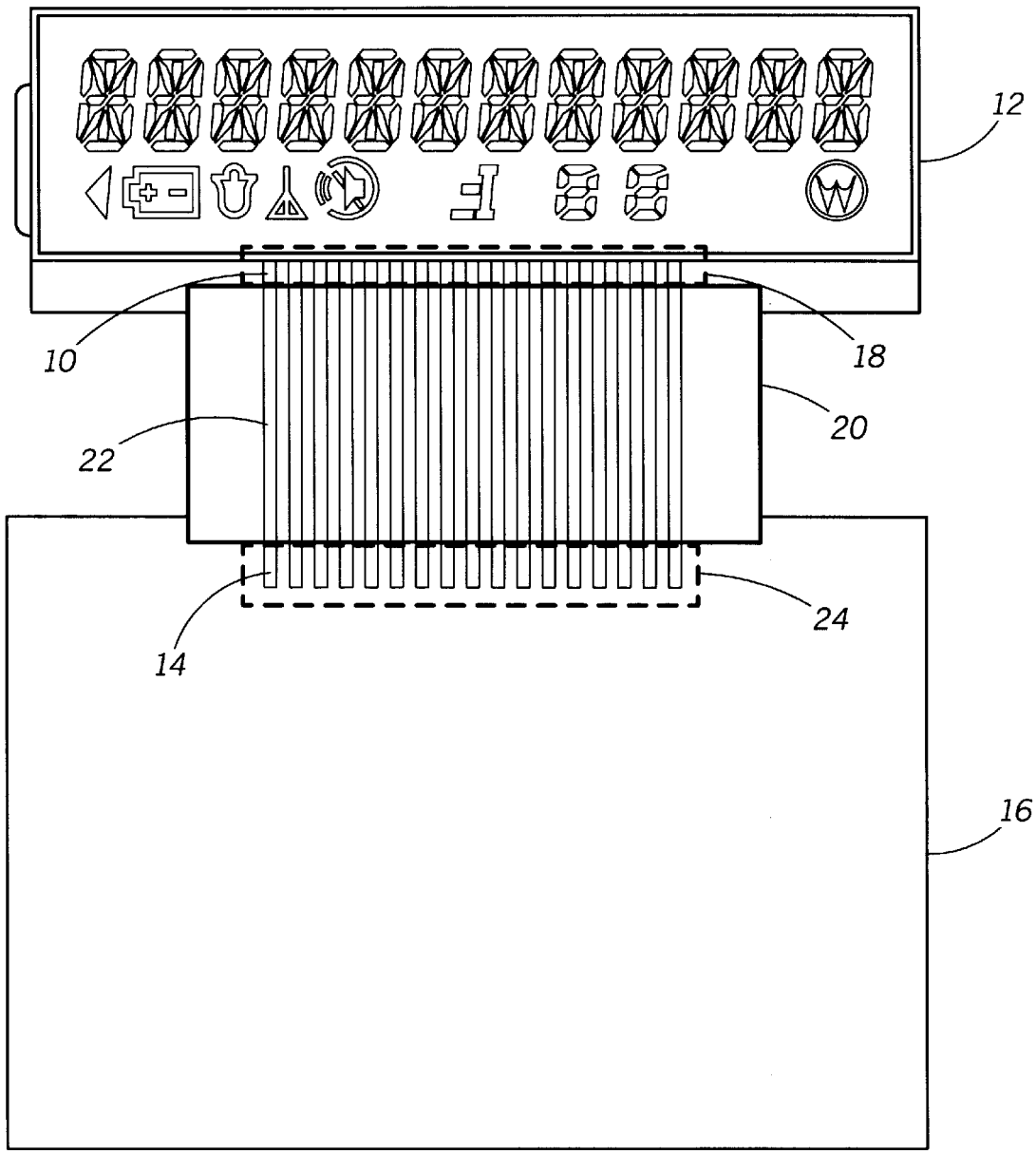
FIG. 1 illustrates a conventional technique for making electrical connections between an electrical component and a substrate.

Since the heat seal bond between the heat seal connector 34 and the substrate 32 and the heat seal bond between heat seal connector 34 and the electrical component 40 are independent processes, it is obvious to one skilled in the art that an alternate embodiment would be a connection according to the illustrated invention between the heat seal connector 34 and the substrate 32, and a conventional connection (such as using the component conductive connector 18 as shown in FIG. 1) between the heat seal connector 34 and the electrical component 40. Similarly, another alternate embodiment would be a conventional connection between the heat seal connector 34 and the substrate 32, and a connection (such as using the substrate conductive connector 24 as shown in FIG. 1) according to the illustrated invention between the heat seal connector 34 and the electrical component 40.

Figure 4:
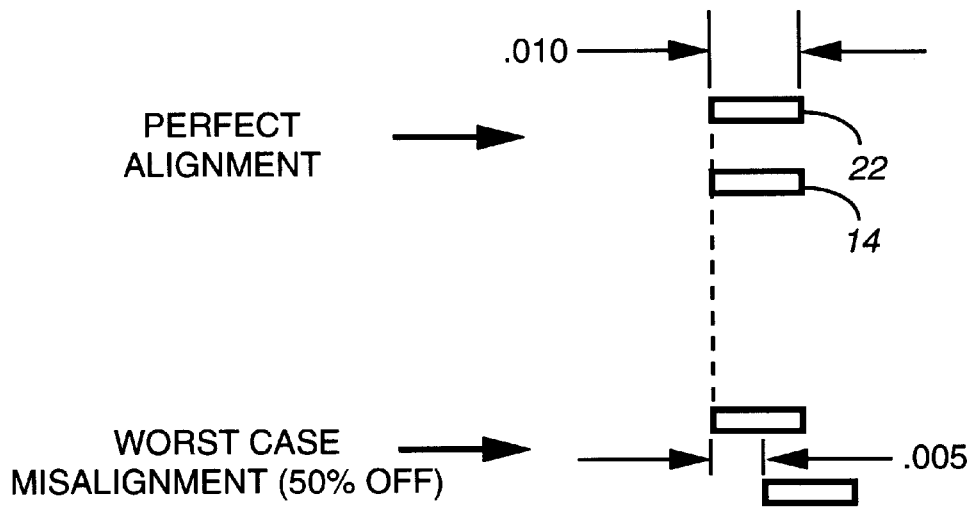
FIG. 4 and FIG. 5 illustrate certain tolerances that are achieved using the present invention as compared to conventional connection techniques.

FIG. 4 shows an edge view of a conventional arrangement in which a conventional substrate conductive runner 14 is intended to contact a conventional heat seal conductive runner 22, where a pitch of 20 mils is used, and both the conventional substrate conductive runner 14 and the conventional heat seal conductive runner 22 have a width of 10 mils. The conventional substrate conductive runner 14 and the conventional heat seal conductive runner 22 are shown, in one case, as being in perfect alignment with each other; and are also shown for worst case misalignment (50% off), in which an allowable tolerance of 5.0 mils results.

Figure 5:
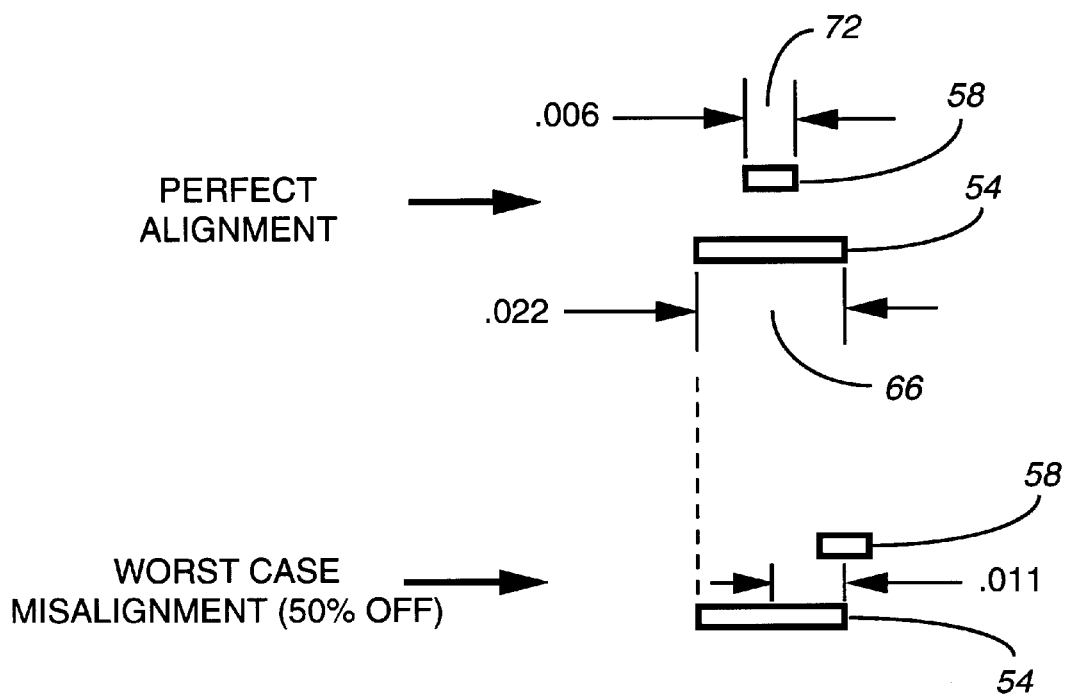

FIG. 5 shows an edge view of an arrangement according to the invention, implementing a similar scenario to that of FIG. 4, in which a heat seal conductive runner 58 is intended to contact a substrate conductive pad 54 using a pitch of 20 mils. The heat seal conductive runner 58 has a heat seal runner width 72 of 6 mils in this example, which is a typical minimum manufacturable runner width. The corresponding substrate pad width 66 is calculated using the formula:

substrate pad width=(2*pitch)−(2*gap)−runner width

Where the gap is defined as the distance between the edge of a pad and the edge of an adjacent runner. For this example, a typical minimum manufacturable gap of 6 mils is used.

Thus, using the given values:
pitch=20 mils
gap=6 mils
runner width=6 mils
substrate pad width=22 mils With the heat seal runner width 72 of 6 mils and the substrate pad width 66 of 22 mils, FIG. 5 illustrates a resulting worst case allowable misalignment of 11 mils. Thus, even if the heat seal conductive runner 58 is 11 mils out of registration with the substrate conductive pad 54, there will be an acceptable connection between them. This is a major improvement over the allowable tolerance of 5 mils in the conventional arrangement of FIG. 4.

The improved tolerance window resulting from the described invention over conventional techniques creates a higher output and better yield in the manufacturing assembly process, while leaving fixed costs the same. It also allows for the use of tooling pins to locate the HSC with respect to the PCB, eliminating the need for operator dependent manual alignment.

Although the invention has been described in terms of preferred embodiments, it will be obvious to those skilled in the art that various alterations and modifications may be made without departing from the invention. Accordingly, it is intended that all such alterations and modifications be considered as within the spirit and scope of the invention as defined by the appended claims.

What is claimed is:

1. An assembly including an electrical component, a substrate, and an apparatus for connecting the electrical component and the substrate, comprising:

a plurality of component conductive runners and a plurality of component conductive pads on a surface of the electrical component, the component conductive pads alternating with the component conductive runners;

a plurality of substrate conductive runners and a plurality of substrate conductive pads on a surface of the substrate, the substrate conductive pads alternating with the substrate conductive runners; and a connector, attached to the electrical component and attached to the substrate to electrically connect the electrical component and the substrate, wherein the connector includes a plurality of conductive runners and a plurality of conductive pads, the conductive pads alternating with the conductive runners, and further wherein the conductive pads are in alignment with the substrate conductive runners and the conductive runners are in alignment with the substrate conductive pads.

2. An assembly as set forth in claim 1, wherein the conductive pads are further in alignment with the component conductive runners and the conductive runners are further in alignment with the component conductive pads.

3. An assembly including an electrical component, a substrate, and an apparatus for connecting the electrical component and the substrate, comprising:

a plurality of component conductive runners and a plurality of component conductive pads on a surface of the electrical component, the component conductive pads alternating with the component conductive runners, with each component conductive pad having a component pad width and each component conductive runner having a component runner width, wherein the component pad widths are substantially equal, wherein the component runner widths are substantially equal, and wherein the component pad width is 2 to 5 times the component runner width;

a plurality of substrate conductive runners and a plurality of substrate conductive pads on a surface of the substrate, the substrate conductive pads alternating with the substrate conductive runners, with each substrate conductive pad having a substrate pad width and each substrate conductive runner having a substrate runner width, wherein the substrate pad widths are substantially equal, wherein the substrate runner widths are substantially equal, and wherein the substrate pad width is 2 to 5 times the substrate runner width; and a connector, attached to the electrical component and attached to the substrate to electrically connect the electrical component and the substrate, wherein the connector includes a plurality of conductive runners and a plurality of conductive pads, the conductive pads alternating with the conductive runners, with each conductive pad having a pad width and each conductive runner having a runner width, wherein the pad widths are substantially equal, wherein the runner widths are substantially equal, and wherein the pad width is 2 to 5 times the runner width, and further wherein the conductive pads are in alignment with the substrate conductive runners and the conductive runners are in alignment with the substrate conductive pads.

4. An assembly as set forth in claim 3, wherein the conductive pads are further in alignment with the component conductive runners and the conductive runners are further in alignment with the component conductive pads.

5. An assembly including an electrical component, a substrate, and an apparatus for connecting the electrical component and the substrate, comprising:

a plurality of component conductive runners and a plurality of component conductive pads on a surface of the electrical component, the component conductive pads alternating with the component conductive runners, with each component conductive pad having a component pad width and each component conductive runner having a component runner width, wherein the component pad width is 2 to 5 times the component runner width;

a plurality of substrate conductive runners and a plurality of substrate conductive pads on a surface of the substrate, the substrate conductive pads alternating with the substrate conductive runners, with each substrate conductive pad having a substrate pad width and each substrate conductive runner having a substrate runner width, wherein the substrate pad width is 2 to 5 times the substrate runner width;

a connector, attached to the electrical component and attached to the substrate to electrically connect the electrical component and the substrate, wherein the connector includes a plurality of conductive runners and a plurality of conductive pads, the conductive pads alternating with the conductive runners, with each conductive pad having a pad width and each conductive runner having a runner width, wherein the pad width is 2 to 5 times the runner width;

wherein the conductive pads are in alignment with the component conductive runners and the conductive runners are in alignment with the component conductive pads; and wherein the component pad width, the substrate pad width, and the pad width are substantially equal, and wherein the component runner width, the substrate runner width, and the runner width are substantially equal.

6. An assembly as set forth in claim 5, wherein the conductive pads are further in alignment with the substrate conductive runners and the conductive runners are further in alignment with the substrate conductive pads.

7. A display assembly, comprising:

a LCD having a bonding shelf;

a plurality of component conductive pads and a plurality of component conductive runners on the bonding shelf, the component conductive pads and component conductive runners being alternately arranged;

a substrate;

a plurality of substrate conductive pads and a plurality of substrate conductive runners on the surface of the substrate, the substrate conductive pads and the substrate conductive runners being alternately arranged; and a connector, attached to the electrical component and attached to the substrate to electrically connect the component conductive pads and the substrate conductive runners, and to further electrically connect the component conductive runners and the substrate conductive pads, wherein the connector includes a plurality of conductive runners and a plurality of conductive pads, the conductive pads alternating with the conductive runners.

8. A display assembly as set forth in claim 7, wherein the conductive pads are in alignment with the substrate conductive runners and the conductive runners are in alignment with the substrate conductive pads.

9. A display assembly as set forth in claim 8, wherein the conductive pads are further in alignment with the component conductive runners and the conductive runners are further in alignment with the component conductive pads.

10. An assembly including an electrical component, a substrate, and an apparatus for connecting the electrical component and the substrate, comprising:

a component conductive connector on the electrical component;

a plurality of substrate conductive runners and a plurality of substrate conductive pads on a surface of the substrate, the substrate conductive pads alternating with the substrate conductive runners; and a connector, attached to the electrical component and attached to the substrate to electrically connect the electrical component and the substrate, wherein the connector includes a plurality of conductive runners and a plurality of conductive pads, the conductive pads alternating with the conductive runners, and further wherein the conductive pads are in alignment with the substrate conductive runners and the conductive runners are in alignment with the substrate conductive pads.

11. An assembly including an electrical component, a substrate, and an apparatus for connecting the electrical component and the substrate, comprising:

a plurality of component conductive runners and a plurality of component conductive pads on a surface of the electrical component, the component conductive pads alternating with the component conductive runners;

a substrate conductive connector on the substrate; and a connector, attached to the electrical component and attached to the substrate to electrically connect the electrical component and the substrate, wherein the connector includes a plurality of conductive runners and a plurality of conductive pads, the conductive pads alternating with the conductive runners, and further wherein the conductive pads are in alignment with the component conductive runners and the conductive runners are in alignment with the component conductive pads.

12. An assembly including an electrical component, a substrate, and an apparatus for connecting the electrical component and the substrate, comprising:

a component conductive connector on the electrical component;

a plurality of substrate conductive runners and a plurality of substrate conductive pads on a surface of the substrate, the substrate conductive pads alternating with the substrate conductive runners, with each substrate conductive pad having a substrate pad width and each substrate conductive runner having a substrate runner width, wherein the substrate pad widths are substantially equal, and wherein the substrate runner widths are substantially equal; and a connector, attached to the component conductive connector and attached to the substrate to electrically connect the electrical component and the substrate, wherein the connector includes a plurality of conductive runners and a plurality of conductive pads, the conductive pads alternating with the conductive runners, with each conductive pad having a pad width and each conductive runner having a runner width, wherein the pad widths are substantially equal, wherein the runner widths are substantially equal, wherein the conductive pads are in alignment with the substrate conductive runners and the conductive runners are in alignment with the substrate conductive pads, and wherein the pad width is 2 to 5 times the substrate runner width and the substrate pad width is 2 to 5 times the runner width.

13. An assembly including an electrical component, a substrate, and an apparatus for connecting the electrical component and the substrate, comprising:

a plurality of component conductive runners and a plurality of component conductive pads on a surface of the electrical component, the component conductive pads alternating with the component conductive runners, with each component conductive pad having a component pad width and each component conductive runner having a component runner width, wherein the component pad widths are substantially equal, and wherein the component runner widths are substantially equal;

a substrate conductive connector on the substrate; and a connector, attached to the electrical component and attached to the substrate conductive connector to electrically connect the electrical component and the substrate, wherein the connector includes a plurality of conductive runners and a plurality of conductive pads, the conductive pads alternating with the conductive runners, with each conductive pad having a pad width and each conductive runner having a runner width, wherein the pad widths are substantially equal, wherein the runner widths are substantially equal, wherein the conductive pads are in alignment with the component conductive runners and the conductive runners are in alignment with the component conductive pads, and wherein the pad width is 2 to 5 times the component runner width and the component pad width is 2 to 5 times the runner width.

* * * * *